United States Patent
Ueyama et al.

(10) Patent No.: US 8,048,475 B2
(45) Date of Patent: Nov. 1, 2011

(54) METHOD OF FABRICATING SUPERCONDUCTING WIRE AND SUPERCONDUCTING APPARATUS

(75) Inventors: Munetsugu Ueyama, Osaka (JP); Kazuya Ohmatsu, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 427 days.

(21) Appl. No.: 12/063,941

(22) PCT Filed: Aug. 30, 2006

(86) PCT No.: PCT/JP2006/317077
§ 371 (c)(1),
(2), (4) Date: Feb. 15, 2008

(87) PCT Pub. No.: WO2007/032207
PCT Pub. Date: Mar. 22, 2007

(65) Prior Publication Data
US 2009/0137399 A1    May 28, 2009

(30) Foreign Application Priority Data

Sep. 16, 2005  (JP) ................. 2005-270225

(51) Int. Cl.
*B05D 5/12*  (2006.01)
(52) U.S. Cl. .......................... 427/62; 505/470
(58) Field of Classification Search .......... 427/62; 505/230, 236, 237, 238, 470
See application file for complete search history.

(56) References Cited

U.S. PATENT DOCUMENTS

| | | | |
|---|---|---|---|
| 3,930,109 A * | 12/1975 | Brandt et al. | 428/422 |
| 5,143,897 A | 9/1992 | Ziemek et al. | |
| 5,762,778 A | 6/1998 | Ameen et al. | |
| 5,932,523 A | 8/1999 | Fujikami et al. | |
| 6,271,474 B1 * | 8/2001 | Fujikami et al. | 174/125.1 |
| 7,048,840 B1 * | 5/2006 | Werfel et al. | 205/51 |
| 2002/0144838 A1 * | 10/2002 | Fritzemeier et al. | 174/125.1 |
| 2003/0091855 A1 | 5/2003 | Tanaka et al. | |
| 2004/0149588 A1 | 8/2004 | Aiba et al. | |
| 2004/0266628 A1 * | 12/2004 | Lee et al. | 505/238 |

FOREIGN PATENT DOCUMENTS

CN    1158915    9/1997
(Continued)

OTHER PUBLICATIONS

PCT International Search Report dated Dec. 4, 2006 for PCT/JP2006/317077.

(Continued)

*Primary Examiner* — Jessica L Ward
*Assistant Examiner* — Paul Wartalowicz
(74) *Attorney, Agent, or Firm* — Foley & Lardner LLP

(57) ABSTRACT

An object of the present invention is to provide a method of fabricating a superconducting wire that can reduce the fabrication cost and increase the mechanical strength of the superconducting wire, and a superconducting apparatus including a superconducting wire obtained by the method. The present invention provides a method of fabricating a superconducting wire including the steps of forming a superconducting layer on a substrate or an intermediate layer formed on the substrate, forming a silver stabilization layer on the superconducting layer, immersing the substrate in a copper sulfate solution after the superconducting layer and the silver stabilization layer are formed thereon, and forming a copper stabilization layer on the silver stabilization layer by electroplating with the copper sulfate solution as a plating bath. A superconducting apparatus including a superconducting wire obtained by the method is also provided.

2 Claims, 3 Drawing Sheets

FOREIGN PATENT DOCUMENTS

| | | |
|---|---|---|
| CN | 1275176 A | 11/2000 |
| CN | 1455829 A | 11/2003 |
| CN | 1509351 A | 6/2004 |
| EP | 1038994 A1 | 9/2000 |
| JP | 7-037444 | 2/1995 |
| JP | 7-335051 | 12/1995 |
| JP | 2000-200518 | 7/2000 |
| RU | 2 022 061 C1 | 10/1994 |
| RU | 2 031 463 C1 | 3/1995 |
| RU | 2 080 673 C1 | 5/1997 |
| RU | 2 081 937 C1 | 6/1997 |
| RU | 2 099 806 C1 | 12/1997 |
| WO | WO 02/16674 * | 2/2002 |

OTHER PUBLICATIONS

Decision on Grant dated Feb. 17, 2009 for related Russian Patent Application No. 2008114831/09(016430).

Office Action dated Aug. 11, 2010 and English translation from related Chinese application No. 200680034101.4.

* cited by examiner

METHOD OF FABRICATING SUPERCONDUCTING WIRE AND SUPERCONDUCTING APPARATUS

TECHNICAL FIELD

The present invention relates to a method of fabricating a superconducting wire, and to a superconducting apparatus.

BACKGROUND ART

FIG. 9 schematically shows an example of a conventional superconducting wire in cross-section. The conventional superconducting wire has a structure in which an intermediate layer 2 composed of cerium oxide or yttria-stabilized-zirconia, for example, a superconducting layer 3 composed of an oxide superconductor of a Ho—Ba—Cu—O system or a Y—Ba—Cu—O system, for example, and a silver stabilization layer 4 serving as a stabilization layer for superconducting layer 3 and composed of silver are successively laid on a substrate 1 composed of a Ni alloy and the like (for example, see FIG. 1 of Japanese Patent Laying-Open No. 07-37444 (Patent Document 1)).

In the above-mentioned conventional superconducting wire, variation in the amount of oxygen in the oxide superconductor forming superconducting layer 3 significantly changes characteristics of superconducting layer 3. Therefore, it is common to adjust the amount of oxygen in the oxide superconductor forming superconducting layer 3 by performing heat treatment after silver stabilization layer 4 is formed on superconducting layer 3.

There is a problem, however, that the fabrication cost is increased if a large amount of silver is used to form silver stabilization layer 4 since silver is a relatively expensive material for an industrial material. In addition, there is also a problem that the superconducting wire cannot obtain enough mechanical strength if silver stabilization layer 4 is employed.

In order to solve such problems, there has been proposed a method to affix copper foil uniformly onto superconducting layer 3 of a superconducting wire in a longitudinal direction by soldering.

Patent Document 1: Japanese Patent Laying-Open No. 07-37444

DISCLOSURE OF THE INVENTION

Problems to be Solved by the Invention

In the aforementioned method to affix copper foil, however, there is a problem that a sophisticated technology is required to uniformly affix the copper foil onto the superconducting wire in the longitudinal direction by soldering and that poor adhesion between the copper foil and the superconducting layer is likely to cause peeling.

In light of the aforementioned circumstances, an object of the present invention is to provide a method of fabricating a superconducting wire that can reduce the fabrication cost as well as can increase the mechanical strength of the superconducting wire, and a superconducting apparatus including a superconducting wire obtained by the method.

Means for Solving the Problems

The present invention provides a method of fabricating a superconducting wire including the steps of forming a superconducting layer on a substrate or an intermediate layer formed on the substrate, forming a silver stabilization layer on the superconducting layer, immersing the substrate in a copper sulfate solution after the superconducting layer and the silver stabilization layer are formed thereon, and forming a copper stabilization layer on the silver stabilization layer by electroplating with the copper sulfate solution as a plating bath. To note, in the present invention, another layer may be interposed between the substrate and the superconducting layer. In addition, another layer may be interposed between the superconducting layer and the silver stabilization layer.

In the method of fabricating a superconducting wire according to the present invention, current density at the surface of an object to be plated is preferably less than 10 $A/dm^2$ in electroplating.

In addition, in the method of fabricating a superconducting wire according to the present invention, it is preferable that the silver stabilization layer is formed to a thickness not more than 5 μm and the copper stabilization is formed to a thickness of at least 10 μm.

The present invention also provides a superconducting apparatus including a superconducting wire obtained by the above-described method of fabricating a superconducting wire.

Effects of the Invention

With the present invention, a method of fabricating a superconducting wire that can reduce the manufacturing cost and increase the mechanical strength of the superconducting wire, and a superconducting apparatus including a superconducting wire obtained by the method can be provided.

Figure 1:
FIG. 1 is a schematic cross-sectional view of a preferred example of a substrate employed in the present invention.

DESCRIPTION OF THE REFERENCE SIGNS 1 substrate, 2 intermediate layer, 3 superconducting layer, 4 silver stabilization layer, 5 copper stabilization layer, 6 electrode, 7 copper sulfate solution, 8 container

Best Modes for Carrying Out the Invention

Hereinafter, a preferred example of a method of fabricating a superconducting wire according to the present invention will be described. To note, the same reference characters denote the same or corresponding elements in the drawings of the present invention.

As shown in the schematic cross-sectional view of FIG. 1, a substrate 1 in the form of a tape is prepared, for example. An electrically conductive substrate formed of an alloy including nickel as the main component can be employed for substrate 1, for example. It is preferable that an alloy including nickel as the main component is employed for substrate 1 and it is in particular preferable that the alloy including nickel as the main component includes tungsten. To note, "main component" in the present invention means to account for at least 50% of the total number of atoms that form the substrate.

Figure 2:
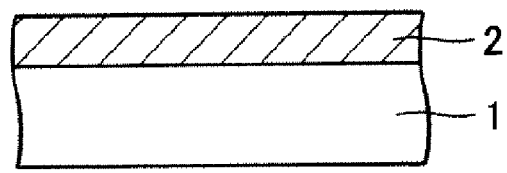
FIG. 2 is a schematic cross-sectional view of a preferred example of the substrate employed in the present invention after forming an intermediate layer.

Then, as shown in the schematic cross-sectional view of FIG. 2, an intermediate layer 2 is formed on substrate 1. For example, at least one electrically conductive layer selected from the group consisting of a cerium oxide layer, a yttria-stabilized-zirconia layer (YSZ layer), a GdZrO layer including gadolinia and zirxonia, and a magnesium oxide layer can be employed for intermediate layer 2. In particular, it is preferable that a three-layer structure in which a cerium oxide layer, a YSZ layer and a cerium oxide layer are successively laid on substrate 1 is used for intermediate layer 2.

Herein, the composition of the YSZ layer is represented by the following composition formula (1):

$$(ZrO_2)_{1-x}(Y_2O_3)_x \quad (1)$$

In the composition formula (1), 1-x represents the composition ratio of $ZrO_2$ (zirconia), and x represents the composition ratio of $Y_2O_3$ (yttria). To note, in the composition formula (1), x is a real number that satisfies $0.03 \leq x \leq 0.1$.

Intermediate layer 2 can be formed, for example, by at least one method selected from the group consisting of sputtering, laser abrasion, electron beam deposition, and IBAD (Ion Beam Assist Deposition).

Figure 3:
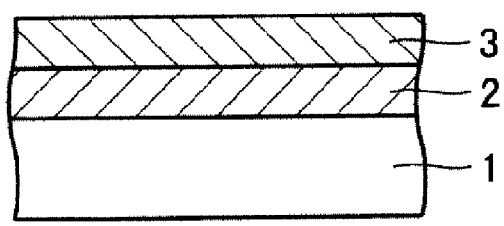
FIG. 3 is a schematic cross-sectional view of a preferred example of the substrate employed in the present invention after forming a superconducting layer.

Then, as shown in the schematic cross-sectional view of FIG. 3, a superconducting layer 3 is formed on intermediate layer 2. Herein, for superconducting layer 3, an oxide superconductor of a Re—Ba—Cu—O system such as an oxide superconductor of a Ho—Ba—Cu—O system including holmium (Ho), barium (Ba), copper (Cu) and oxygen (O) or an oxide superconductor of a Y—Ba—Cu—O system including yttrium (Y), barium (Ba), copper (Cu) and oxygen (O) can be employed, for example. Re denotes a rare earth element, and in addition to Ho and Y, gadolinium (Gd) or samarium (Sm) can be employed for Re, for example.

Herein, the composition of the oxide superconductor of the Re—Ba—Cu—O system is represented by the following composition formula (2):

$$Re_aBa_bCu_cO_d \quad (2)$$

In the composition formula (2), a represents the composition ratio of the rare earth element, b represents the composition ratio of barium, c represents the composition ratio of copper, and d represents the composition ratio of oxygen. To note, in the composition formula (2), a is a real number satisfying $0.7 \leq a \leq 1.3$, b is a real number satisfying $1.7 \leq b \leq 2.3$, c is a real number satisfying $2.7 \leq c \leq 3.3$ and d is a real number satisfying $6 \leq d \leq 8$. Among oxide superconductors of the Re—Ba—Cu—O system, an oxide superconductor of the Ho—Ba—Cu—O system with a composition that is represented by a composition formula where Re in the composition formula (2) is replaced with Ho is preferably employed for superconducting layer 3.

In addition, superconducting layer 3 can be formed, for example, by at least one method selected from the group consisting of sputtering, laser abrasion, MOD (Metal Organic Deposition) and MOCVD (Metal Organic Chemical Vapor Deposition).

Figure 4:
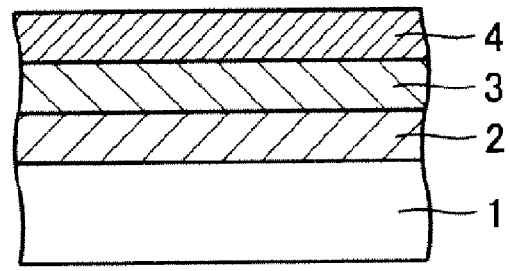
FIG. 4 is a schematic cross-sectional view of a preferred example of the substrate employed in the present invention after forming a silver stabilization layer.

Subsequently, as shown in the schematic cross-sectional view of FIG. 4, a silver stabilization layer 4 is formed on superconducting layer 3. Herein, silver stabilization layer 4 can be formed, for example, by using at least one method such as sputtering to deposit a film composed of silver on superconducting layer 3. Preferably, silver stabilization layer 4 is formed to a thickness not more than 5 μm. If silver stabilization layer 4 is formed to a thickness more than 5 μm, the fabrication cost tends to be increased since a large amount of silver is used to form silver stabilization layer 4 and low mechanical strength of silver tends to lead to insufficient mechanical strength of the superconducting wire. In addition, silver stabilization layer 4 is preferably formed to a thickness of at least 1 μm. If silver stabilization layer 4 is formed to a thickness less than 1 μm, protection for superconducting layer 3 may be insufficient. Accordingly, due to the above reasons, it is preferable that the thickness of silver stabilization layer 4 is at least 1 μm and not more than 5 μm.

Figure 5:
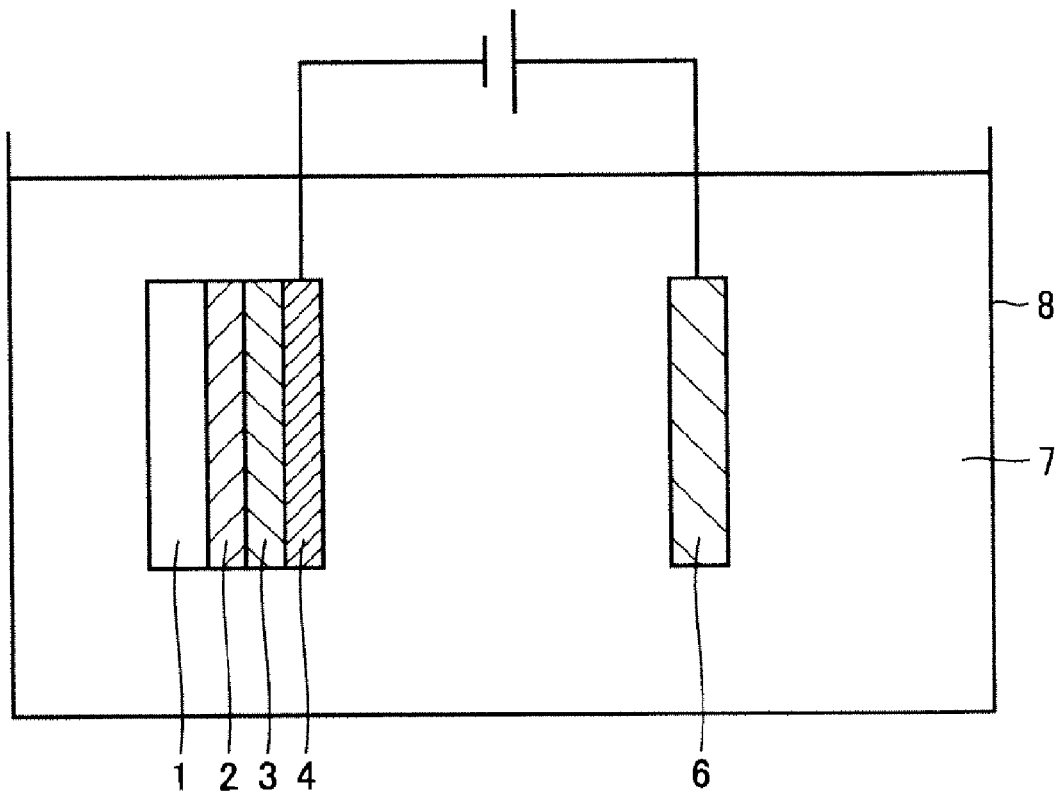
FIG. 5 is a schematic construction view of a preferred example of an electroplating device employed in the present invention.

Then, as shown in the schematic construction view of FIG. 5, substrate 1 having intermediate layer 2, superconducting layer 3 and silver stabilization layer 4 successively formed thereon is immersed as a negative pole in a copper sulfate solution 7 serving as a plating bath contained in a container 9 and an electrode 6 is immersed as a positive pole. Then, electroplating is performed by applying voltage between silver stabilization layer 4 and electrode 6 such that electrode 6 has higher electric potential than that of silver stabilization layer 4. Thereby, as shown in the schematic cross-sectional view of FIG. 6, a copper stabilization layer 5 is formed on the surface of silver stabilization layer 4 to provide a superconducting wire according to the present invention.

Herein, in the electroplating, a current density of the surface of an object to be plated is preferably less than 10 A/dm², and in particular, not more than 9 A/dm². If the current density of the surface of the object to be plated is at least 10 A/dm² in the electroplating, the current density may be too large to form copper stabilization layer 5 with high adhesion. If the current density of the surface of the object to be plated is not more than 9 A/dm² in the electroplating, copper stabilization layer 5 with high adhesion tends to be formed.

Further, copper stabilization layer 5 is preferably formed to a thickness of at least 10 μm. If copper stabilization layer 5 is formed to a thickness less than 10 μm, copper stabilization layer 5 is thin and cannot sufficiently function as an electrical stabilization layer. Accordingly, when a superconducting state is lost, copper stabilization layer 5 may possibly be burnt, or the mechanical strength of copper stabilization layer 5 may be insufficient to cause deterioration of superconducting characteristics due to handling. Moreover, copper stabilization layer 5 is preferably formed to a thickness not more than 50 μm. Accordingly, due to the above reasons, it is preferable that the thickness of copper stabilization layer 5 is at least 10 μm and not more than 50 μm.

Figure 6:
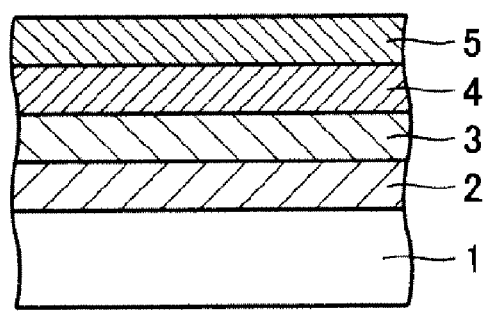
FIG. 6 is a schematic cross-sectional view of a preferred example of a superconducting wire according to the present invention.

It is noted that copper may be deposited on the surface of substrate 1 or the like by the electroplating, however, it is not shown in FIG. 6 for convenience of explanation.

Any conventionally known additive such as a gloss agent may be added to the copper sulfate solution 7 as needed.

The thus obtained superconducting wire according to the present invention can be employed for superconducting apparatus such as superconducting cables, superconducting motors, generators, magnetic separation devices, magnets for single crystal growing furnaces, MRI (Magnetic Resonance Imaging), NMR (Nuclear Magnetic Resonance), linear motor cars or a transformer, for example.

EXAMPLES

Example 1

A substrate with orientation composed of an alloy of nickel and tungsten and in the form of a tape of 10 mm in width, 100 m in length and 0.1 mm in thickness was prepared. In the substrate, nickel accounted for 95% of the total number of atoms forming the substrate, and tungsten accounted for 5% of the total number of atoms forming the substrate.

Then, a first cerium oxide layer of 0.1 m in thickness was formed on the substrate by sputtering. Subsequently, a YSZ layer of 1 μm in thickness was formed on the first cerium oxide layer by laser abrasion. In addition, a second cerium oxide layer of 0.1 μm in thickness was formed on the YSZ layer by sputtering. Thus, an intermediate layer having a three layer structure where the first cerium oxide layer, the YSZ layer and the second cerium oxide layer were successively laid on the substrate was formed on the substrate. Herein, the YSZ layer had a composition represented by a composition formula $(ZrO_2)_{0.92}(Y_2O_3)_{0.08}$.

Subsequently, on the intermediate layer, a superconducting layer of 1 μm in thickness and composed of an oxide superconductor of the Ho—Ba—Cu—O system with a composition represented by a composition formula $HoBa_2Cu_3O_{7-\delta}$ satisfying the formula (2) was formed by laser abrasion.

Then, on the superconducting layer, a silver stabilization layer of 3 μm in thickness was formed by sputtering.

Thereafter, an object to be plated having the intermediate layer, the superconducting layer and the silver stabilization layer successively formed on the substrate was immersed as a negative pole in a copper sulfate solution serving as a plating bath contained in a container, and an electrode was immersed as a positive pole. Electroplating was performed by applying voltage between the silver stabilization layer and the electrode such that the electrode had higher electrical potential than that of the silver stabilization layer to form a copper stabilization layer of 10 μm in thickness on the silver stabilization layer. Thus, a superconducting wire according to Example 1 was obtained. Herein, the electroplating was performed such that the current density of the surface of the object to be plated was 3 A/dm² in the electroplating.

The appearance of the thus fabricated superconducting wire according to Example 1 was inspected and it was found that the superconducting wire according to Example 1 had gloss and a smooth surface and that the copper stabilization layer had very high adhesion.

Example 2

A superconducting wire according to Example 2 was fabricated in the same method and conditions as in Example 1 except that the copper stabilization layer was formed to a thickness of 20 μm.

The appearance of the thus fabricated superconducting wire according to Example 2 was inspected in the same manner as in Example 1 and it was found that the superconducting wire according to Example 2 also had gloss and a smooth surface similarly to the superconducting wire according to Example 1, and that the copper stabilization layer had very high adhesion.

Comparative Example 1

A superconducting wire according to Comparative Example 1 was fabricated in the same method and conditions as in Example 1 except that a copper cyanide solution was used as a plating bath instead of the copper sulfate solution.

The appearance of the thus fabricated superconducting wire according to Comparative Example 1 was inspected in the same manner as in Example 1 and it was found that there were many portions where the copper stabilization layer was not fixed and adhesion was insufficient in the superconducting wire according to Comparative Example 1. In addition, in the superconducting wire according to Comparative Example 1, there were many portions where the plating bath soaked into the superconducting wire to cause change in color.

Comparative Example 2

A superconducting wire according to Comparative Example 2 was fabricated in the same method and conditions as in Comparative Example 1 except that the copper stabilization layer was formed to a thickness of 20 μm.

The appearance of the thus fabricated superconducting wire according to Comparative Example 2 was inspected in the same manner as in Example 1 and it was found that there were many portions where the copper stabilization layer was not fixed and adhesion was insufficient in the superconducting wire according to Comparative Example 2. In addition, in the superconducting wire according to Comparative Example 2, there were many portions where the plating bath soaked into the superconducting wire to cause change in color.

The results of the inspection of the appearance of each of the superconducting wires according to Examples 1-2 and Comparative Examples 1-2 are shown in Table 1.

TABLE 1

| | Plating Bath | Current Density (A/dm²) | Thickness of Silver Stabilization Layer (μm) | Thickness of Copper Stabilization Layer (μm) | Appearance |
|---|---|---|---|---|---|
| Example 1 | Copper sulfate solution | 3 | 3 | 10 μm | With gloss Good adhesion |
| Example 2 | Copper sulfate solution | 3 | 3 | 20 μm | With gloss Good adhesion |
| Comparative Example 1 | Copper cyanide solution | 3 | 3 | 10 μm | With change in color Poor adhesion |
| Comparative Example 2 | Copper cyanide solution | 3 | 3 | 20 μm | With change in color Poor adhesion |

As shown in Table 1, it was found that the superconducting wires according to Examples 1 and 2 where the copper stabilization layer was formed by electroplating with the copper sulfate solution as a plating bath had higher adhesion and better appearance without change in color, compared with the superconducting wires according to Comparative Examples 1 and 2 where the copper cyanide solution was employed as a plating bath.

Comparative Example 3

A superconducting wire according to Comparative Example 3 was fabricated in the same method and conditions as in Example 1 except that the copper stabilization layer was not formed.

(Measurement of Critical Current)

Critical current was measured in the superconducting wires according to Examples 1 and 2 and Comparative Example 3. As a result, measurement of critical current was possible for the superconducting wires according to Examples 1 and 2, however, critical current of the superconducting wire according to Comparative Example 3 could not be measured since the superconducting wire was burnt during the measurement.

Example 3

A superconducting wire according to Example 3 was fabricated in the same method and conditions as in Example 1 except that the current density of the surface of the object to be plated was 2 $A/dm^2$ in the electroplating and electroplating was performed for 23 minutes.

The appearance of the thus fabricated superconducting wire according to Example 3 was inspected in the same manner as in Example 1 and it was found that the superconducting wire according to Example 3 also had gloss and a smooth surface similarly to the superconducting wire according to Example 1 and that the copper stabilization layer had very high adhesion.

Example 4

A superconducting wire according to Example 4 was fabricated in the same method and conditions as in Example 1 except that the current density of the surface of the object to be plated was 2 $A/dm^2$ in the electroplating and electroplating was performed for 45 minutes to form a copper stabilization layer of 20 μm in thickness.

The appearance of the thus fabricated superconducting wire according to Example 4 was inspected in the same manner as in Example 1 and it was found that the superconducting wire according to Example 4 also had gloss and a smooth surface similarly to the superconducting wire according to Example 1 and that the copper stabilization layer had very high adhesion.

Example 5

A superconducting wire according to Example 5 was fabricated in the same method and conditions as in Example 1 except that the current density of the surface of the object to be plated was 3 $A/dm^2$ in the electroplating and electroplating was performed for 15 minutes.

The appearance of the thus fabricated superconducting wire according to Example 5 was inspected in the same manner as in Example 1 and it was found that the superconducting wire according to Example 5 also had gloss and a smooth surface similarly to the superconducting wire according to Example 1 and that the copper stabilization layer had very high adhesion.

Example 6

A superconducting wire according to Example 6 was fabricated in the same method and conditions as in Example 1 except that the current density of the surface of the object to be plated was 3 $A/dm^2$ in the electroplating and electroplating was performed for 30 minutes to form a copper stabilization layer of 20 μm in thickness.

The appearance of the thus fabricated superconducting wire according to Example 6 was inspected in the same manner as in Example 1 and it was found that the superconducting wire according to Example 6 also had gloss and a smooth surface similarly to the superconducting wire according to Example 1 and that the copper stabilization layer had very high adhesion.

Example 7

A superconducting wire according to Example 7 was fabricated in the same method and conditions as in Example 1 except that the current density of the surface of the object to be plated was 3 $A/dm^2$ in the electroplating and electroplating was performed for 10 minutes to form a copper stabilization layer of 6 μm in thickness.

The appearance of the thus fabricated superconducting wire according to Example 7 was inspected in the same manner as in Example 1 and it was found that the superconducting wire according to Example 7 also had gloss and a smooth surface similarly to the superconducting wire according to Example 1 and that the copper stabilization layer had very high adhesion. However, the superconducting characteristics were deteriorated due to the handling during the measurement of critical current.

Example 8

A superconducting wire according to Example 8 was fabricated in the same method and conditions as in Example 1 except that the current density of the surface of the object to be plated was 5 $A/dm^2$ in the electroplating and electroplating was performed for 10 minutes to form a copper stabilization layer of 10 μm in thickness.

The appearance of the thus fabricated superconducting wire according to Example 8 was inspected in the same manner as in Example 1 and it was found that the superconducting wire according to Example 8 also had gloss and a smooth surface similarly to the superconducting wire according to Example 1 and that the copper stabilization layer had very high adhesion.

Example 9

A superconducting wire according to Example 9 was fabricated in the same method and conditions as in Example 1 except that the current density of the surface of the object to be plated was 9 $A/dm^2$ in the electroplating and electroplating was performed for 10 minutes to form a copper stabilization layer of 18 μm in thickness.

The appearance of the thus fabricated superconducting wire according to Example 9 was inspected in the same manner as in Example 1 and it was found that the superconducting wire according to Example 9 also had gloss and a smooth surface similarly to the superconducting wire according to Example 1 and that the copper stabilization layer had very high adhesion.

Example 10

A superconducting wire according to Example 10 was fabricated in the same method and conditions as in Example 1 except that the current density of the surface of the object to be plated was 10 $A/dm^2$ in the electroplating and electroplating was performed for 10 minutes to form a copper stabilization layer of 20 μm in thickness.

The appearance of the thus fabricated superconducting wire according to Example 10 was inspected in the same manner as in Example 1 and it was found that in the superconducting wire according to Example 10, there were portions with powdery bloom on the copper stabilization layer and that the copper stabilization layer had relatively insufficient adhesion as compared with the superconducting wire according to Example 1.

The results of the inspection of the appearance of each of the superconducting wires according to Examples 3-10 are shown in Table 2.

To note, in equation (3), R shows a diameter with which a circle of curvature is formed when the superconducting wire is bent, and T shows a thickness of the superconducting wire.

Figure 7:
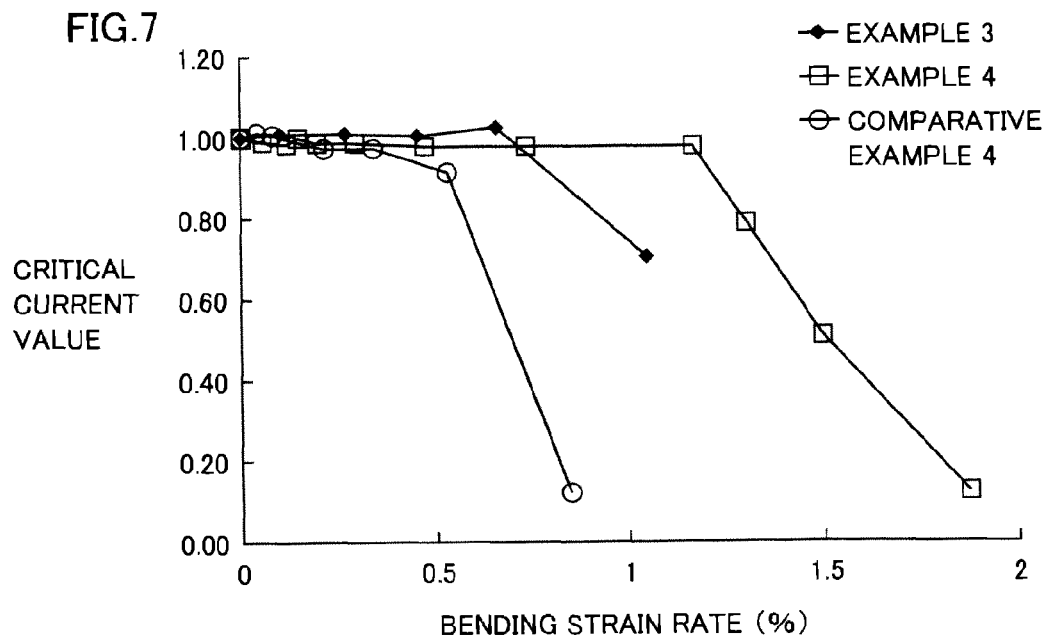
FIG. 7 shows the relation between a bending strain rate and a critical current in a superconducting wire according to the present invention and a conventional superconducting wire.

As apparent from FIG. 7, it was found that the superconducting wires according to Examples 3 and 4 that had a copper stabilization layer fabricated by electroplating with the copper sulfate solution as a plating bath were likely to allow a larger critical current to flow therethrough even when the bending strain rate was increased and showed superior superconducting characteristics, compared with the superconducting wire according to Comparative Example 4 where no copper stabilization layer was formed but only a silver stabilization layer was formed.

TABLE 2

| | Plating Bath | Current Density (A/dm$^2$) | Electroplating Period (minutes) | Thickness of Silver Stabilization Layer (μm) | Thickness of Copper Stabilization Layer (μm) | Appearance |
|---|---|---|---|---|---|---|
| Example 3 | Copper sulfate solution | 2 | 23 | 3 | 10 μm | With gloss Good adhesion |
| Example 4 | Copper sulfate solution | 2 | 45 | 3 | 20 μm | With gloss Good adhesion |
| Example 5 | Copper sulfate solution | 3 | 15 | 3 | 10 μm | With gloss Good adhesion |
| Example 6 | Copper sulfate solution | 3 | 30 | 3 | 20 μm | With gloss Good adhesion |
| Example 7 | Copper sulfate solution | 3 | 10 | 3 | 6 μm | With gloss Good adhesion |
| Example 8 | Copper sulfate solution | 5 | 10 | 3 | 10 μm | With gloss Good adhesion |
| Example 9 | Copper sulfate solution | 9 | 10 | 3 | 18 μm | With gloss Good adhesion |
| Example 10 | Copper sulfate solution | 10 | 10 | 3 | 20 μm | Relatively poor adhesion |

As shown in Table 2, the superconducting wires according to Examples 3-9 that were fabricated by electroplating using the copper sulfate solution as a plating bath with the current density of the surface of the object to be plated of less than 10 A/dm$^2$ were likely to have higher adhesion and superior appearance without change in color compared with the superconducting wire according to Example 10 that was fabricated with the current density of 10 A/dm$^2$. Accordingly, the current density of the surface of the object to be plated in electroplating is preferably less than 10 A/dm$^2$, and in particular, not more than 9 A/dm$^2$.

Comparative Example 4

A superconducting wire according to Comparative Example 4 was fabricated in the same method and conditions as in Example 1 except that the copper stabilization layer was not formed and the silver stabilization layer was formed to a thickness of 20 μm.

(Relation Between Bending Strain Rate and Critical Current)

The relation between a bending strain rate and a critical current was examined for the superconducting wires according to Examples 3 and 4 and Comparative Example 4. The results are shown in FIG. 7. To note, in FIG. 7, the horizontal axis shows a bending strain rate (%), and the vertical axis shows a critical current value (relative value) at each bending strain rate with the critical current value when the bending strain rate is 0% defined as 1. The bending strain rate in FIG. 7 was calculated by the following equation (3):

$$\text{Bending strain rate}(\%) = 100 \times (T/2)/\{R + (T/2)\} \quad (3)$$

(Relation Between Tensile Stress and Critical Current)

Figure 8:
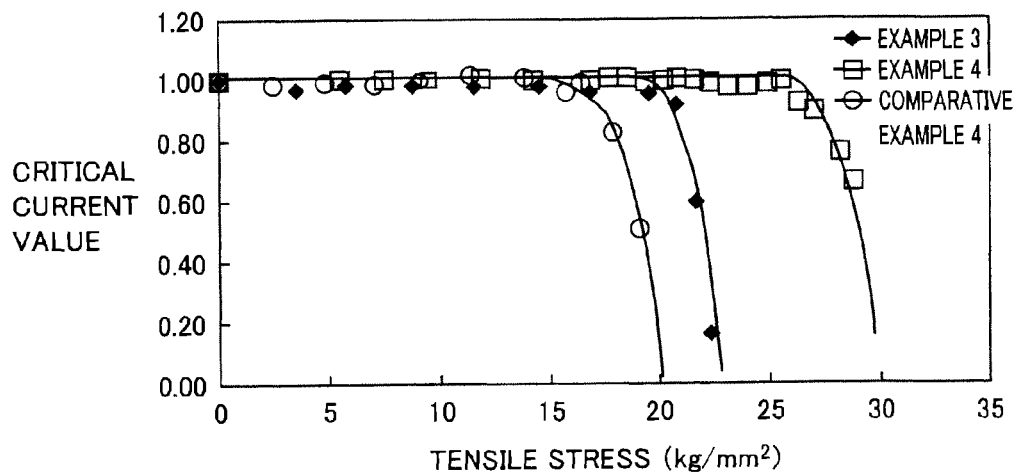
FIG. 8 shows the relation between a tensile stress and a critical current in a superconducting wire according to the present invention and a conventional superconducting wire.
Figure 9:
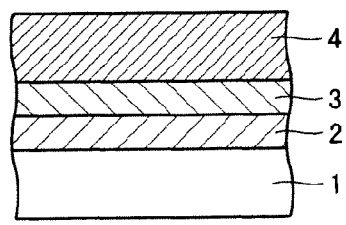
FIG. 9 is a schematic cross-sectional view of an example of a conventional superconducting wire.

The relation between a tensile stress and a critical current was examined for the superconducting wires according to Example 3 and 4 and Comparative Example 4, respectively. The results are shown in FIG. 8. To note, in FIG. 8, the horizontal axis shows a tensile stress (kg/mm$^2$), and the vertical axis shows a critical current value (relative value) at each tensile stress with the critical current value when the tensile stress is 0 defined as 1. In addition, the tensile stress in FIG. 8 is a tensile stress (kg) applied to the cross section of the superconducting wire per 1 mm$^2$ that is perpendicular to the tensile direction.

As apparent from FIG. 8, it was found that the superconducting wires according to Examples 3 and 4 that had a copper stabilization layer fabricated by electroplating with the copper sulfate solution as a plating bath were likely to allow a larger critical current to flow therethrough even when the tensile stress was increased and showed superior superconducting characteristics, compared with the superconducting wire according to Comparative Example 4 where no copper stabilization layer was formed but only a silver stabilization layer was formed.

With the present invention, a portion of a silver stabilization layer of a conventional superconducting wire can be replaced with a copper stabilization layer to enable reduction in the amount of use of silver that is industrially expensive, and thus the fabrication cost of the superconducting wire can be reduced. As well, mechanical strength of the superconducting wire can be improved with use of copper having mechanical strength higher than that of silver. Moreover, the copper stabilization layer is formed by electroplating with a copper sulfate solution as a plating bath. This provides a superconducting wire with higher adhesion and superior appearance without change in color. More specifically, in order to obtain a copper stabilization layer with higher adhesion, the current density of the surface of the object to be plated in electroplating is preferably less than 10 A/dm$^2$, in particular, not more than 9 A/dm$^2$.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

With the present invention, a method of fabricating a superconducting wire that can reduce the fabrication cost and improve the mechanical strength of the superconducting wire, and a superconducting apparatus including a superconducting wire obtained by the method can be provided.

The invention claimed is:

1. A method of fabricating a superconducting wire, comprising:
    forming a superconducting layer on a substrate or an intermediate layer formed on the substrate;
    forming a silver stabilization layer on said superconducting layer;
    immersing said substrate in a copper sulfate solution after said superconducting layer and said silver stabilization layer are formed; and
    forming a copper stabilization layer on a surface of said silver stabilization layer by electroplating with said copper sulfate solution as a plating bath including applying a potential during electroplating to provide a current density on the surface of the silver stabilization layer from 2 A/dm$^2$ to 9 A/dm$^2$;
    wherein the surface of the silver stabilization layer is exposed to the copper sulfate solution prior to the formation of the copper layer.

2. The method of fabricating a superconducting wire according to claim 1, wherein
    said silver stabilization layer is formed to a thickness not more than 5 μm and said copper stabilization layer is formed to a thickness of at least 10 μm.

* * * * *